United States Patent
Oyama et al.

(10) Patent No.: US 7,429,757 B2
(45) Date of Patent: Sep. 30, 2008

(54) SEMICONDUCTOR LIGHT EMITTING DEVICE CAPABLE OF INCREASING ITS BRIGHTNESS

(75) Inventors: Toshihiko Oyama, Niiza (JP); Nobuo Kobayashi, Niiza (JP); Hideyuki Osawa, Niiza (JP); Toshio Ogata, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 14 days.

(21) Appl. No.: 10/518,798

(22) PCT Filed: Jun. 10, 2003

(86) PCT No.: PCT/JP03/07359

§ 371 (c)(1),
(2), (4) Date: Nov. 7, 2005

(87) PCT Pub. No.: WO2004/001862

PCT Pub. Date: Dec. 31, 2004

(65) Prior Publication Data

US 2006/0102917 A1    May 18, 2006

(30) Foreign Application Priority Data

Jun. 19, 2002 (JP) ............... 2002-179230
Jun. 19, 2002 (JP) ............... 2002-179240
Jun. 19, 2002 (JP) ............... 2002-179244
Jun. 19, 2002 (JP) ............... 2002-179245

(51) Int. Cl.
    *H01L 33/00* (2006.01)
(52) U.S. Cl. ............... 257/98; 257/79; 257/99; 257/E33.072
(58) Field of Classification Search ............. 257/80–84, 257/676, 680, 730, 98–100, E33.057, E33.059, 257/E33.072, 79, 91, 93
See application file for complete search history.

(56) References Cited

U.S. PATENT DOCUMENTS 5,291,038 A * 3/1994 Hanamoto et al. ............. 257/82

(Continued)

FOREIGN PATENT DOCUMENTS

JP        52070783        6/1977

(Continued)

*Primary Examiner*—Wai-Sing Louie
(74) *Attorney, Agent, or Firm*—Bachman & LaPointe, P.C.

(57) ABSTRACT

A semiconductor light emitting device comprises a metallic support plate 1; a light-reflective reflector 3 mounted on the support plate 1 and formed with a hole 3a; a semiconductor light emitting element 2 mounted on the support plate 1 within the hole 3a of the reflector 3, and a plastic encapsulant 6 for sealing an outer periphery of the reflector 3 and an upper surface 1c of the support plate 1. As the reflector 3 is electrically connected to a wiring conductor 5 or a lead wire 8 extends through a notch 3k formed in the reflector 3 to electrically connect the semiconductor light emitting element 2 and wiring conductor 5, wiring span of the lead wire 8 can be shortened to prevent deformation of the lead wire 8. Simultaneously, diameter of the reflective surface 3c in the reflector 3 is reduced and height of the reflector 3 is increased to improve directivity and axial brightness of light from the semiconductor light emitting device. Also, formation of the hole 3a effectively prevents further thermal degradation of heat-resistible plastic encapsulant 6 or other resin components.

13 Claims, 17 Drawing Sheets

U.S. PATENT DOCUMENTS

| | | | |
|---|---|---|---|
| 6,459,130 B1 * | 10/2002 | Arndt et al. | 257/432 |
| 6,608,334 B1 * | 8/2003 | Ishinaga | 257/100 |
| 6,653,661 B2 * | 11/2003 | Okazaki | 257/98 |
| 2004/0126913 A1 * | 7/2004 | Loh | 438/26 |
| 2004/0201028 A1 * | 10/2004 | Waitl et al. | 257/99 |
| 2005/0014302 A1 * | 1/2005 | Brunner et al. | 438/22 |

FOREIGN PATENT DOCUMENTS

| | | |
|---|---|---|
| JP | 55-135469 | 9/1980 |
| JP | 60-103841 | 7/1985 |
| JP | 1309201 | 12/1989 |
| JP | 09-7409 | 1/1997 |
| JP | 10-242526 | 9/1998 |
| JP | 11-214754 | 8/1999 |
| JP | 11-340378 | 12/1999 |
| JP | 11340517 | 12/1999 |
| JP | 2000077725 | 3/2000 |
| JP | 2000261041 | 9/2000 |
| JP | 2001345482 | 12/2001 |
| JP | 2002094122 | 3/2002 |

* cited by examiner

SEMICONDUCTOR LIGHT EMITTING DEVICE CAPABLE OF INCREASING ITS BRIGHTNESS

TECHNICAL FIELD

This invention relates to a semiconductor light emitting device and a reflector for such a semiconductor light emitting device, in particular a semiconductor light emitting device, a method for producing the same and a reflector for the semiconductor light emitting device capable of avoiding harmful effect by heat and deformation of a lead wire connected to a light emitting element when they may occur with heavy electric current through the light emitting device.

BACKGROUND OF THE INVENTION

Japanese Patent Disclosure No. 11-340517 discloses a semiconductor light emitting device which comprises an insulating substrate formed with wiring conductors, a semiconductor element attached on a main surface of the substrate, a reflector (a light reflecting plate) surrounding the semiconductor element on the substrate, and a light-transmittable plastic encapsulant for encapsulating the semiconductor element and reflector. FIG. 36 illustrates a known semiconductor light emitting device which comprises an insulating substrate 100, an island wiring conductor or die pad 120 and a terminal wiring conductor or bonding pad 130 formed separately from each other on a main surface 101 of insulating substrate 100, an semiconductor element or light emitting diode chip 140 secured on island wiring conductor 120, a lead wire 150 for electrically connecting an electrode on an upper surface of semiconductor element 140 and terminal wiring conductor 130, and a light-transmittable plastic encapsulant 160 for encapsulating each portion of island and terminal wiring conductors 120, 130 on main surface of insulating substrate 100, semiconductor element 140, and lead wire 150.

Island and terminal wiring conductors 120, 130 extend outwardly on main surface 101 of substrate 100, then are bent downwardly along each end surface 103, 104 and moreover are bent along a bottom surface 102 of substrate 100 to form bottom contact electrodes. Light emitted from an upper surface of diode chip 140 is irradiated to the outside through plastic encapsulant 160. The shown light emitting diode device can be surface-mounted on a circuit board with bottom surface 102 of substrate 100 in contact to the circuit board.

Light emitting diode device comprises a reflector 110 on main surface 101 of substrate 100 for surrounding diode chip 140. Substrate 100 is formed of glass fiber into a plate of the rectangular section with flat main and bottom surfaces 101, 102, and the plate is impregnated with resin. Island and terminal wiring conductors 120, 130 are formed by plating nickel and gold in turn on copper base materials attached to substrate 100 according to a printing technique. Island wiring conductor 120 comprises an island 121 formed on main surface 101 of substrate 100, an island electrode 122 extending from one end of main surface 101 of substrate 100 through end surface 103 to one end of bottom surface 102, and a narrow island wiring 123 on main surface 101 of substrate 100 for electrically connecting island 121 and island electrode 122.

Terminal wiring conductor 130 comprises a terminal 131 on main surface 101 of substrate 100, a terminal electrode 132 extending from the other end of main surface 101 of substrate 100 through end surface 104 to the other end of bottom surface 102, and a terminal wiring 133 on main surface 101 of substrate 100 for electrically connecting terminal 131 and terminal electrode 132. Terminal 131 is disposed out of a central line 108 to reduce a longitudinal length of substrate for manufacture of light emitting diode in smaller size with reflector 110 that has a ring portion 111 on main surface 101 of substrate 100.

Semiconductor light emitting element 140 is a gallium compound semiconductor such as gallium arsenic (GaAs), gallium phosphorus (GaP), gallium aluminum arsenic (GaAlAs), aluminum gallium indium phosphorus (AlGaInP), etc. A bottom electrode (not shown) of light emitting element 140 is secured substantially at the center of island 121 through an electrically conductive bonding agent. An upper electrode (not shown) of light emitting element 140 is connected to terminal 131 through lead wire 150 striding over ring portion 111 of reflector 110.

Reflector 110 has ring portion 111 and flange portions 112 provided on opposite outer sides of ring portion 111 and is formed of liquid crystal or ABS resin blended with white powder. Formed inside of ring portion 111 of reflector 110 is a reflecting surface 113 which is upwardly diverged or flaring to form a portion of conical, spheric or paraboloidal surface or similar surface thereto or combined surfaces thereof. A bottom end of reflecting surface 113 is positioned within island 121 so that light emitting element 140 is positioned within reflecting surface 113 and surrounded by ring portion 111 which is higher than light emitting element 140. Ring portion 111 is on the outer periphery of island 121, inner end of island wiring 123 and inner end of terminal 131. Flange portions 112 of reflector 110 are formed along opposite sides 105, 106 of substrate 100 and extends inwardly or widthwise to merge with ring portions 111.

Plastic encapsulant 160 comprises a pair of ramp surfaces 161, 162 which are positioned respectively inside of electrodes 124, 134, and incline respectively relative to end surfaces 103, 104 at a given angle, a pair of vertical surfaces 163, 164 which are substantially flush respectively with side surfaces of substrate 100, and a flat top surface 165 between and substantially normal to vertical surfaces 163, 164. As seen in FIG. 36, plastic encapsulant 160 covers island 121, terminal 131, each inner portion of island and terminal wirings 123, 133, reflector 110, light emitting element 140 and lead wire 150, except electrodes 124, 134, and each outer portion of islant and terminal wirings 123, 133. Each flange portion 112 of reflector 110 has a bare side surface 114 which is flush with side surface 105 or 106 and vertical surface 163 or 164 of plastic encapsulant 160.

Recent attempts have been made to adopt such semiconductor light emitting devices as light sources for traffic signals or rear lumps of automobile, and in this case, semiconductor light emitting devices must product the greater light output for people to certainly and visually observe turning on or off of the light source from an off position. To this end, new high power light emitting semiconductors have already been developed to produce a high intensity light when relatively large electric current for example more than 350 mA is supplied to the light emitting semiconductors, however, they have caused the following various problems. Specifically, when the element is activated with a large electric current over 350 mA, it is heated so that a surface of semiconductor may reach a temperature above 150° C., and therefore, plastic encapsulant is also inconveniently awfully heated by heat from the semiconductor.

As mentioned above, plastic encapsulant is formed of a light-permeable resin to transmit light from light emitting element and emit same outside. Such a resin tends to deteriorate under heat because it contains less additive amount of heat-resistible compound unlike a package for a power transistor or the like. Accordingly, in some cases, heat continuously applied from semiconductor to plastic encapsulant, reduces adhesive force of encapsulant to lead terminals or degrades environmental resistance of encapsulant so that encapsulant is separated from lead terminals to form gaps therebetween. When some foreign matter penetrates semiconductor through the gaps, the semiconductor device deteriorates the electric properties with degradation of product reliability. Furthermore, adhesive force of encapsulant is lowered too much, lead terminals are detached from encapsulant to such an extent of current breaking between semiconductor and lead terminals.

In another aspect, prior art light emitting semiconductor shown in FIG. 36 has the structure wherein lead wire 150 strides over ring portion 111 of reflector 110 to electrically connect semiconductor 140 and terminal 131. When inner diameter of reflector 110 is reduced and height of reflector 110 is increased to improve directivity of light reflected on reflector 110 and brightness (axial brightness) of light from semiconductor element 140 along an optical axis, lead wire 150 must detour along an elevated path to bond a remaining end of lead wire 150 on terminal 131 after a preceding end of lead wire 150 is bonded on semiconductor element 140. Such an arrangement is likely to cause deformation, suspension or inclination of lead wire 150 upon molding of plastic material, which may result in short circuit or breaking accident of lead wire 150. In addition, with increased height of reflector 110, a full amount of transparent resin cannot preferably be injected within reflector 110.

An object of the present invention is to provide a semiconductor light emitting device, method for producing the same and reflector for semiconductor light emitting device which has no harmful effect under heat when the light emitting device is activated with heavy current.

Another object of the present invention is to provide a semiconductor light emitting device, method for producing the same and reflector for semiconductor light emitting device which can prevent deformation of lead wire connected to a semiconductor light emitting element.

Still another object of the present invention is to provide a semiconductor light emitting device, method for producing the same and reflector for semiconductor light emitting device which can increase height of reflector to improve light directivity and axial brightness.

A further object of the present invention is to provide a method for producing a semiconductor light emitting device capable of preferably injecting and filling resin within interior of reflector in forming a plastic encapsulant.

SUMMARY OF THE INVENTION

The semiconductor light emitting device according to the present invention comprises a metallic support plate (1); a light-reflective reflector (3) mounted on the support plate (1) and formed with a hole (3a) upwardly diverging; a semiconductor light emitting element (2) mounted on the support plate (1) within the hole (3a) of the reflector (3), the light emitting element (2) having a first electrode electrically connected to the support plate (1), the light emitting element (2) being in no contact to a heat-deteriorated resin; a first wiring conductor (4) electrically connected to the support plate (1), a second wiring conductor (5) electrically connected to a second electrode of the light emitting element (2); and a heat-resistible plastic encapsulant (6) for sealing at least an outer periphery of the reflector (3), an upper surface (1c) of the support plate (1), each inner end of the first and second wiring conductors (4, 5).

The method for producing a semiconductor light emitting device according to the present invention comprises the steps of providing an assembly (10) which includes a metallic support plate (1) and a light-reflective reflector (3) attached on the support plate (1); mounting a semiconductor light emitting element (2) on the support plate (1); electrically connecting the light emitting element (2) to wiring conductor (5); setting the support plate (1) and reflector (3) in a cavity (23) of a forming mold (20) and clamping the support plate (12) and reflector (3) between upper and lower mold halves (21, 22) of the forming mold (20); and supplying a liquid resin into the cavity (23) of the forming mold (20) to form a plastic encapsulant (6). As the support plate (12) and reflector (3) are clamped between upper and lower mold halves (21, 22) of the forming mold (20), liquid resin is prevented from entering the interior of the reflector (3) to facilitate the molding operation.

The semiconductor light emitting device according to the present invention, comprises a support plate (1); a light-reflective reflector (3) mounted on the support plate (1) and formed with a hole (3a) upwardly diverging; and a semiconductor light emitting element (2) mounted on the support plate (1) within the hole (3a) of the reflector (3). The reflector (3) has a ledge (3d) connected to a wiring conductor (5) to electrically connect the light emitting element (2) and wiring conductor (5) through the ledge (3d) for easy and shortened wiring and improvement in reliability of semiconductor light emitting device. Also, the ledge (3d) can be embedded and securely fixed in the plastic encapsulant (6) by a molding process. In addition, the reflecting surface (3c) can be formed with a smaller diameter and with an increased height to enhance the directivity and axial brightness of light from the light emitting device.

The reflector for semiconductor light emitting device according to the present invention is secured on the support plate (1) surrounding the semiconductor light emitting element (2) on the support plate (1) to reflect upwardly light from the light emitting element (2). The reflector comprises a reflector block (3b) formed with a hole (3a) for defining a reflecting surface (3c) with the upwardly enlarging inner diameter and a notch (3k) formed on the reflector block (3b) between the hole (3a) and an outer side wall (3m) or between the light emitting element (2) and wiring conductor (5). A lead wire (8) passes through the notch (3k) to electrically connect the light emitting element (2) and wiring conductor (5) by substantially straight extending lead wire (8) of the minimum span while the structure prevents the lead wire (8) from being deformed and facilitates connection between the light emitting element (2) and wiring conductor (5) by the lead wire (8). Avoidance of the lead wire (8) along an elevated path over an upper surface of the reflector (3) represses disconnection or breaking of the lead wire (8) to better reliability of the semiconductor light emitting device. Reduction of inner diameter of the reflecting surface (3c) and increase of height of the reflector (3) serve to gain improved light directivity and axial brightness of the reflector (3). Moreover, shorter inner diameter of the reflecting surface (3c) is effective for downsizing the reflector (3).

The semiconductor light emitting device according to the present invention, comprises a support plate (1); a light-reflective reflector (3) having a reflector block (3b) which is mounted on the support plate (1) or integrally formed with the support plate (1), the reflector (3) being formed with a hole (3a) upwardly expanding; a semiconductor light emitting element (2) mounted on the support plate (1) within the hole (3a) of the reflector (3); a first wiring conductor (4) electrically connected to one electrode of the light emitting element (2); a second wiring conductor (5) electrically connected to the other electrode of the light emitting element (2) through a lead wire (8); and a plastic encapsulant (6) for sealing at least the hole (3a) of the reflector (3). The reflector (3) also has a notch (3k) which passes through the reflector block (3b) between the hole (3a) and an outer side wall (3m) and between the light emitting element (2) and wiring conductor (5). The lead wire (8) passes through the notch (3k) to electrically connect the light emitting element (2) and wiring conductor (5) by substantially straight extending lead wire (8) of the minimum span while the structure prevents the lead wire (8) from being deformed and facilitates connection between the light emitting element (2) and wiring conductor (5) by the lead wire (8). Avoidance of the lead wire (8) along an elevated path over an upper surface of the reflector (3) represses disconnection or breaking of the lead wire (8) to better reliability of the semiconductor light emitting device. Reduction of inner diameter of the reflecting surface (3c) and increase of height of the reflector (3) serve to gain improved light directivity and axial brightness of the reflector (3). In another embodiment of the present invention, the notch (3k) of the reflector (3) provides a passage for liquid resin to fill the hole (3a) of the reflector (3) with the liquid resin.

The method for producing a semiconductor light emitting device according to the present invention comprises the steps of forming an assembly (10) which includes a metallic support plate (1) and a light-reflective reflector (3) having a reflector block (3b) attached on or integrally formed with the support plate (1), the reflector block (3b) being formed with a notch (3k) and a hole (3a) with the upwardly increasing radius; mounting a semiconductor light emitting element (2) on the support plate (1) within the hole (3a) of the reflector (3); electrically connecting the light emitting element (2) to a wiring conductor (5) by a lead wire (8) passing through the notch (3k) of the reflector (3); and injecting a liquid resin through the notch (3k) into the hole (3a) of the reflector (3) to form a plastic encapsulant (6).

BRIEF DESCRIPTION OF THE DRAWINGS

Embodiments for high power light emitting diodes (LED) of the semiconductor light emitting device, method for producing the same and reflector for semiconductor light emitting device according to the present invention are described hereinafter with reference to the accompanying drawings.

BEST MODE FOR CARRYING OUT THE INVENTION

Figure 1:
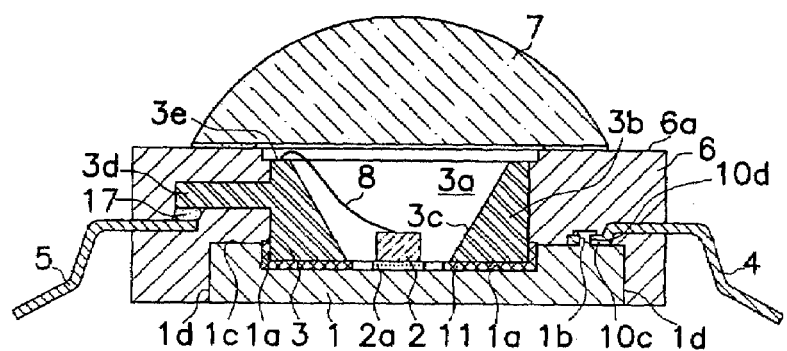
FIG. 1 is a sectional view of a semiconductor light emitting device according to the present invention.

A semiconductor light emitting device shown in FIG. 1 comprises a metallic support plate 1 formed with a recess 1a; a light-reflective reflector 3 mounted in recess 1a of support plate 1 in electrically insulating relation to support plate 1, and formed with a hole 3a upwardly expanding; a light emitting diode 2 mounted on recess 1a of support plate 1 within hole 3a of reflector 3, one electrode (a bottom electrode) of the light emitting diode 2 being electrically connected to support plate 1; a first wiring conductor 4 electrically connected to support plate 1; a second wiring conductor 5 electrically connected to the other electrode (a top electrode) of light emitting diode 2; a lead wire 8 for electrically connecting light emitting diode 2 and reflector 3; a heat-resistible plastic encapsulant 6 for encapsulating outer periphery of reflector 3, upper and side surfaces 1c, 1d of support plate 1, each inner end of first and second wiring conductors 4, 5; and a lens 7 for covering hole 3a of reflector 3 and upper surface 6a of encapsulant 6. The encapsulant has an opening 6b.

Support plate 1 is formed of a metallic material such as copper, aluminum or alloy thereof having the thermal conductivity equal to or more than 190 kcal/mh° C., and reflector 3 may be formed of electrically conductive metal of the same kind as that of support plate 1. Reflector 3 is located in recess 1a and adhered on support plate 1 by means of insulative adhesive such as thermosetting epoxy resin so that upper surface 1a of support plate 1 is exposed in hole 3a of reflector 3. Hole 3a of reflector 3 has the minimum inner diameter which is greater than a width (side length) of light emitting diode 2 on the bottom surface of reflector 3 so that light emitting diode 2 can be attached on a central portion of main surface of support plate 1 exposed in hole 3a of reflector 3 which surrounds light emitting diode 2.

Plastic encapsulant 6 is formed of opaque or semi-transparent resin which has the high softening point and includes relatively large additive amount of heat-resistible compound such as silica. On the contrary, lens 7 is formed of light-transmittable or transparent resin which includes relatively small additive amount of such compound, and therefore, it has relatively low softening point. However, lens 7 is mounted over reflector 3 away from light emitting diode 2 with less direct thermal impact on lens 7 by light emitting diode 2, and therefore, lens 7 may be formed of less heat-resistible resin unlike plastic encapsulant. Otherwise, lens 7 can be omitted if reflector 3 produces the satisfactory outward directivity of light.

Figure 2:
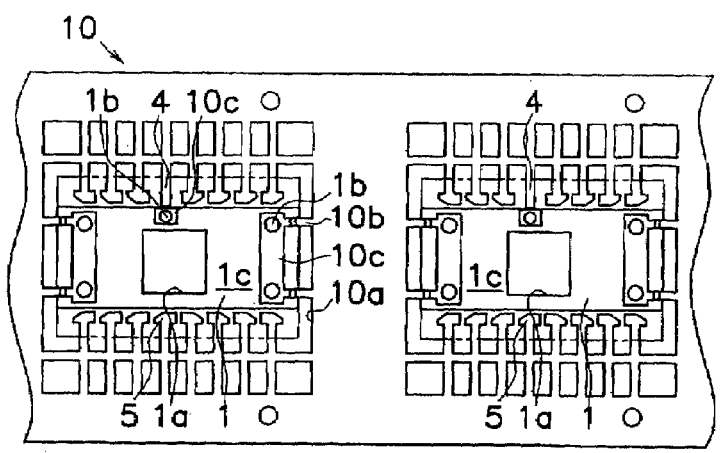
FIG. 2 is a plan view of a lead frame assembly.
Figure 3:
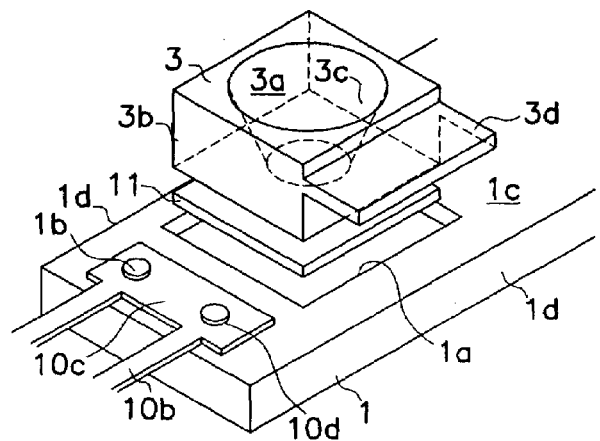
FIG. 3 is a perspective view of a support plate and a reflector of the semiconductor light emitting device shown in FIG. 1.

In producing the semiconductor light emitting device shown in FIG. 1, a lead frame assembly 10 shown in FIG. 2 is prepared by a press forming of a metal strip of for example copper, aluminum or alloy thereof. Lead frame assembly 10 comprises openings 10a formed at intervals, a plurality of wiring conductors 4, 5 inwardly and widthwise extending in each opening 10a, a plurality of support lead 10b inwardly and lengthwise extending in each opening 10a, and brackets 10c each connected to a pair of support lead 10b. As shown in FIG. 3, positioned in each opening 10a is a support plate 1 formed with a recess 1a, and support plate 1 is secured to lead frame assembly 10 by inserting pins 1b projecting from support plate 1 into open holes 10d of brackets 10c, and forging each top of pins 1b.

Figure 4:
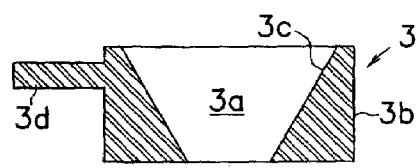
FIG. 4 is a sectional view of the reflector.
Figure 5:
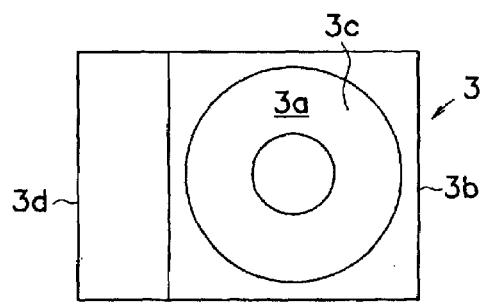
FIG. 5 is a plan view of the reflector shown in FIG. 3.

Then, as shown in FIG. 3, reflector 3 is bonded in recess 1a of support plate 1 via insulative adhesive 11. Simultaneously, an inner end of wiring conductor 5 is adhered to a tip of ledge 3d of reflector 3 via electrically conductive paste (silver paste) 17. As illustrated in FIGS. 3 to 5, reflector 3 comprises a reflector block 3b formed into a generally rectangular shape with conical hole 3a at the center, and ledge 3d extending outwardly from reflector block 3b. Subsequently, as seen from FIG. 6, a cover 12 of PET resin is attached on upper surface of reflector 3 to cover hole 3a of reflector 3, and lead frame assembly 10 is incorporated in forming mold 20.

Forming mold 20 comprises upper and lower mold halves 21, 22 to define a cavity 23, and a total height $L_2$ of support plate 1, reflector 3 and cover 12 is higher than a height H of cavity 23 between upper and lower mold halves 21, 22. A height $L_1$ of support plate 1 plus reflector 3 is slightly lower than cavity's height H. As a result, when upper and lower mold halves 21, 22 are clamped after lead frame assembly 10 with reflector 3 bonded thereon is then mounted in forming mold 20, support plate 1 and reflector 3 are forcibly sandwiched by upper and lower mold halves 21, 22 of forming mold 20, and cover 12 is slightly crushed to bring upper surface of cover 12 into tight contact to upper surface of cavity 23.

Then, liquid resin is injected into cavity 23 through runner and gate, but no resin enters hole 3a shielded by cover 12 which is not fused to reflector 3 under heat during the injection process because PET resin of cover 12 is heat-resistible. After that, lead frame assembly 10 is removed from forming mold 20, and cover 12 is detached from reflector 3 to obtain plastic encapsulant 6 which seals upper main surface 1c and side surfaces 1d of support plate 1 outside of reflector 3 and each inner end of wiring conductors 4, 5, but no resin exists in hole 3a of reflector 3. Plastic encapsulant 6 securely retains reflector 3 therein because ledge 3d is integrally formed with reflector 3 and embedded in plastic encapsulant 6.

Figure 9:
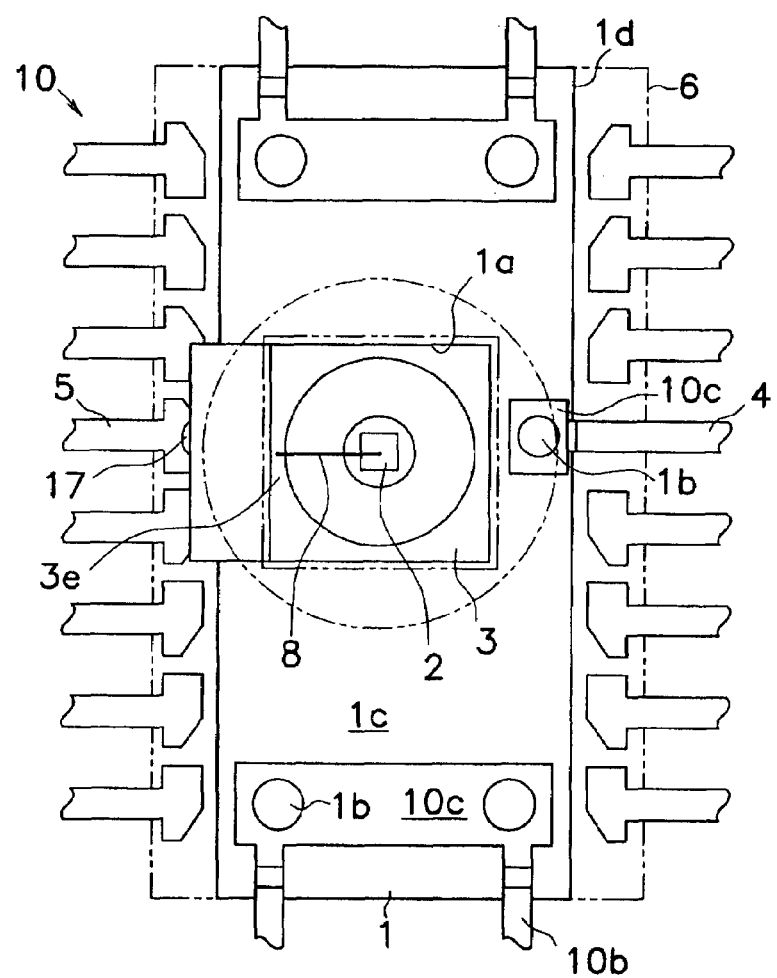
FIG. 9 is a plan view of the lead frame assembly shown in FIG. 8.

Thereafter, as depicted in FIG. 3, a light emitting diode 2 is mounted on main surface 1c of support plate 1 within hole 3a of reflector 3 by solder or electrically conductive paste or adhesive by a well-known die bonder. In this embodiment, light emitting diode 2 is mounted after forming plastic encapsulant 6 (by the transfer molding process), however, order of processes for manufacture can be changed in various ways. Not shown but light emitting diode 2 comprises a semiconductor substrate, and anode and cathode electrodes formed on two main surfaces of the semiconductor substrate, and the cathode electrode is electrically connected to support plate 1. As shown in FIG. 9, anode electrode of light emitting diode 2 is electrically connected to a flat portion 3e of reflector 3 via lead wire 8 formed by a well-known wire bonding technique. Ledge 3d of reflector 3 extends over wiring conductor 5 to electrically connect a bottom tip of ledge 3d and inner end of wiring conductor 5 by conductive paste 17 for electrical communication between anode electrode of light emitting diode 2 and wiring conductor 5.

Next, light-transmittable and heat-resistant silicone resin is filled in hole 3a of reflector 3 by means of a well-known dispenser to coat light emitting diode 2 and lead wire 8 with silicone resin for their protection. Silicone resin is superior in heat resistance to light-transmittable resin for lens 7, however, silicone resin cannot be formed into lens 7. Finally, light-transmittable lens 7 is attached on upper surface of reflector 3 as shown in FIG. 1, and unwanted portions are lopped from lead frame assembly 10 as shown in FIG. 9.

Semiconductor light emitting device demonstrated in FIG. 1 irradiates light when relatively large electric current flows between anode and cathode electrodes of light emitting diode 2. Also, the following effects can be obtained:

[1] Hole 3a of reflector 3 serves to prevent direct contact between light emitting diode 2 and plastic encapsulant 6 or lens 7 for avoidance of thermal deterioration of resin components.

[2] Metallic support plate 1 of high thermal conductivity preferably contributes to radiate to the outside heat produced when light emitting diode 2 is turned on with heavy electric current through first and second wiring conductors 4, 5.

[3] Heat-resistible plastic encapsulant 6 can bear its own thermal deterioration.

[4] Light from light emitting diode 2 can be effectively emitted by internal reflection on reflector 3 with good directivity.

[5] Light emitting diode 2 is surrounded by support plate 1 and reflector 3 to form a protective structure for prohibiting infiltration of moisture or other foreign matters in order to repress degradation of light emitting diode 2 and provide a highly reliable package structure.

[6] Reflective surface 3c of reflector 3 preferably reflects light from light emitting diode 2 toward lens 7. In this embodiment, as light emitted from light emitting diode 2 can be converged by lens 7 with high directivity, inclination angle of conical surface relative to the bottom surface is set at an angle of 30 degrees or more. Reflective surface 3c may be formed into a conical, spheric or paraboloidal surface of revolution or similar or any of various surfaces to reflect light upwardly.

[7] Second wiring conductor 5 is electrically connected to light emitting element 2 through ledge 3d of reflector 3 for easy and shortened wiring and improvement in reliability of semiconductor light emitting devices.

[8] Reflector 3 can be securely insert-molded together with plastic encapsulant.

[9] Improvement in light directivity and axial brightness can be attained by diametrical reduction of reflective surface 3c and height increase of reflector 3.

Figure 6:
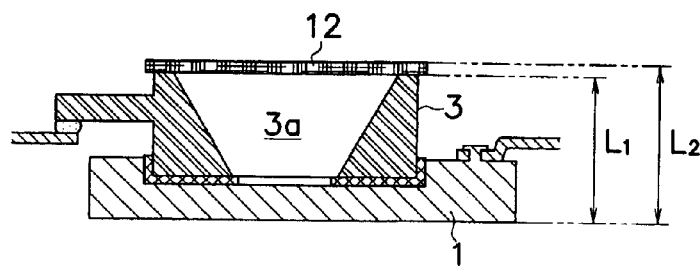
FIG. 6 is a sectional view of the reflector on the support plate with a cover attached on an upper surface of the reflector shown in FIG. 3.
Figure 7:
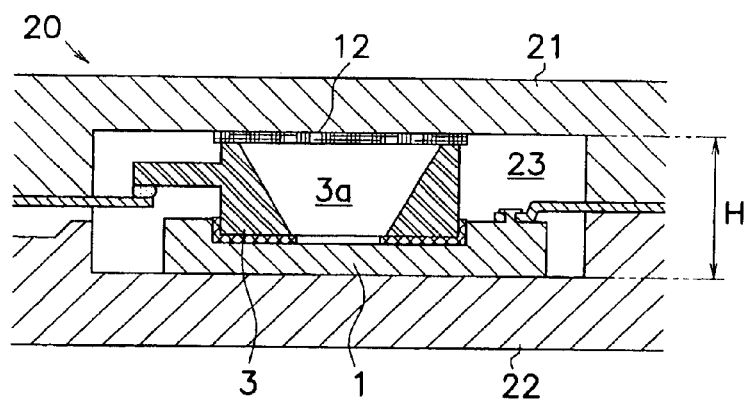
FIG. 7 is a sectional view of the lead frame assembly mounted in a forming mold.
Figure 8:
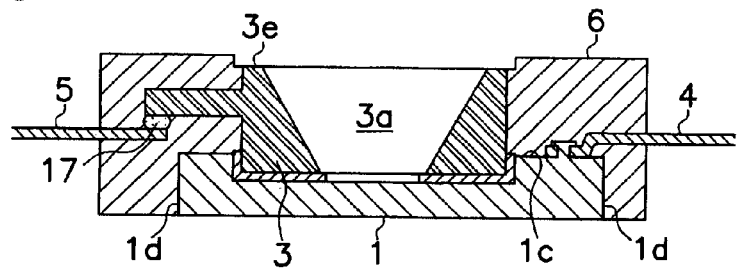
FIG. 8 is a sectional view of the lead frame assembly with a plastic encapsulant formed by an insert molding technique.
Figure 10:
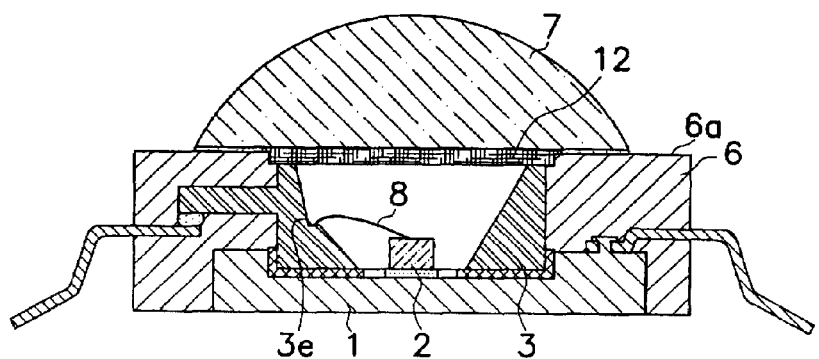
FIG. 10 is a sectional view of a semiconductor light emitting device according to the present invention with a cover attached on an upper surface of the reflector.
Figure 11:
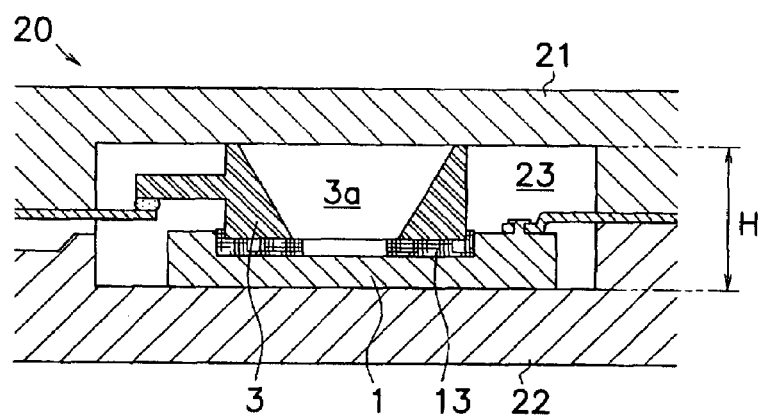
FIG. 11 is a sectional view of a forming mold with a sheet sandwiched between a support plate and a reflector.
Figure 12:
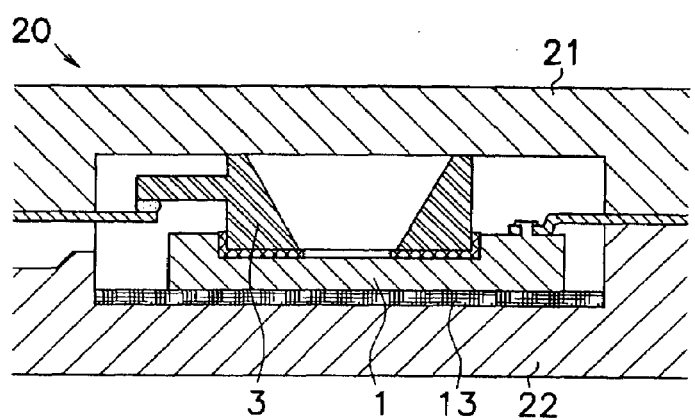
FIG. 12 is a sectional view of a forming mold with a sheet sandwiched between a support plate and a lower mold half.

Various modifications can be made regarding semiconductor light emitting device shown in FIG. 1. As shown in FIG. 6, cover 12 formed of light-transmittable PET resin is attached on upper surface of reflector 3 to seal hole 3a. After molding formation of plastic encapsulant 6, as represented in FIG. 10, lens 7 may be formed on reflector 3, plastic encapsulant 6 and cover 12. Also, as shown in FIG. 10, a flat step 3e may be formed on inner surface of reflector 3. As exhibited in FIG. 11, a sheet 13 made of elastic resin may be inserted between support plate 1 and reflector 3 so that a total height of support plate 1, sheet 13 and reflector 3 is slightly higher than height H of cavity 23. As shown in FIG. 12, a sheet 13 may be inserted between bottom surface of cavity 23 and support plate 1. In this case, sheet 13 can be removed after molding of plastic encapsulant 6.

Figure 13:
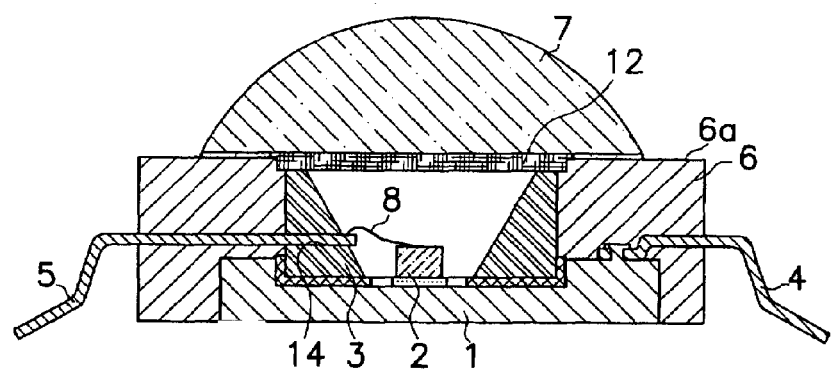
FIG. 13 a sectional view of a semiconductor light emitting device according to the present invention with a wiring conductor passing through a bore formed in a reflector.

As illustrated in FIG. 13, wiring conductor 5 may pass through a radial open hole 14 formed in reflector 3 to electrically connect inner end of wiring conductor 5 and light emitting diode 2 through lead wire 8. In this way, lead wire 8 may electrically connect wiring conductor 5 and electrode of light emitting diode 2 without ledge formed in reflector. Reflector 3 may be mounted on flat main surface 1c of reflector 3 without recess 1a on support plate 1. Light emitting diode 2 may be previously mounted on main surface 1c of support plate 1 before reflector 3 is attached on support plate 1.

Figure 14:
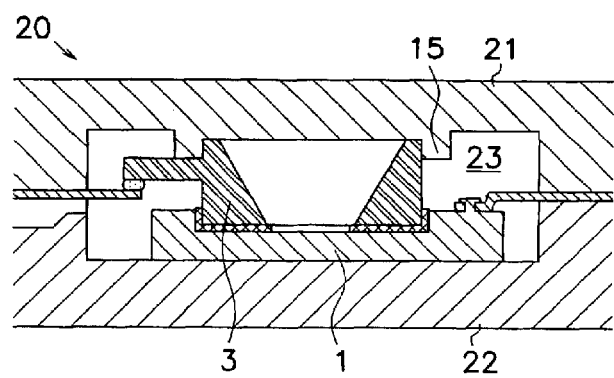
FIG. 14 is a sectional view of a forming mold with an upper mold half formed with a downward annular protrusion in a cavity.

As shown in FIG. 14, top wall of cavity 23 may be provided with a downward annular protrusion 15 formed with upper mold half 21 to cover upper portion of reflector 3 with top wall and annular protrusion 15 of upper mold half 21 without cover 12. Clamping support plate 1 and reflector 3 between upper and lower mold halves 21, 22 of forming mold 20, represses flowing of liquid resin into hole 3a of reflector 3 for easy molding. Upper mold half 21 may be in direct contact to reflector 3 to repress flowing liquid resin into hole 3a without cover 12 or sheet 13. The whole or a selected upper portion of reflector 3 may be formed of soft metal so that the total height $L_1$ of support plate 1 and reflector 3 is slightly higher than height H of cavity 23. In this case, reflector 3 is slightly crushed while upper surface of reflector 3 is in tight contact to top surface of cavity 23 to form plastic encapsulant 6. In another aspect, reflector 3 may be formed of elastic material such as rubber with a reflective metallic film applied to inner surface of reflector 3.

Figure 15:
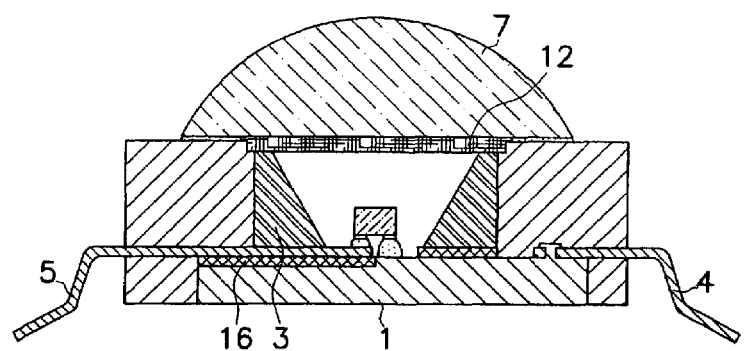
FIG. 15 is a sectional view of a semiconductor light emitting device with a semiconductor chip of bump electrodes.
Figure 16:
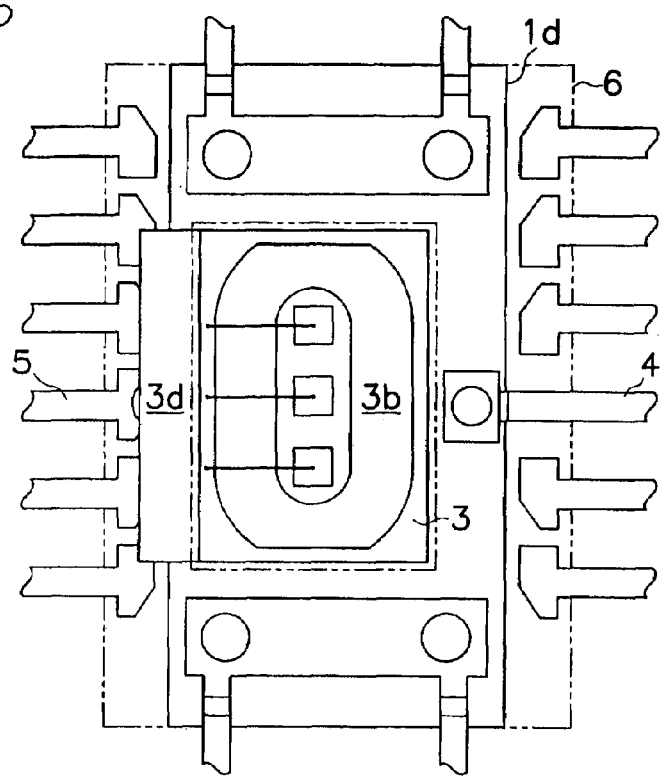
FIG. 16 is a plan view of a semiconductor light emitting device according to the present invention with three light emitting diode chips.
Figure 17:
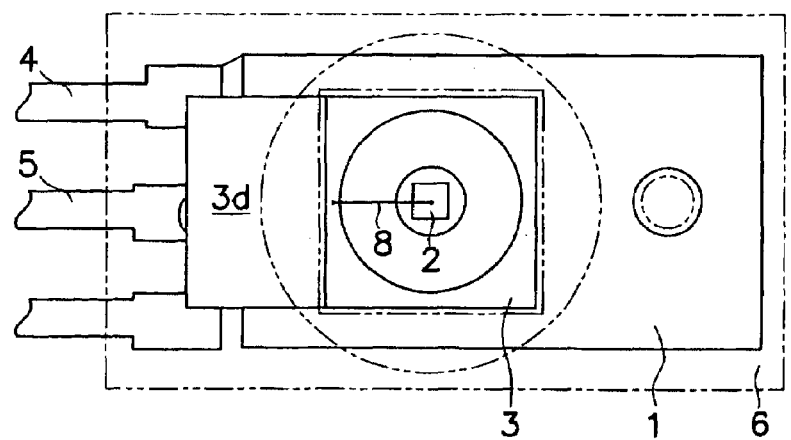
FIG. 17 is a plan view of a semiconductor light emitting device according to the present invention with wiring conductors apposed on one side of a support plate.

FIG. 15 illustrates a light emitting diode 2 which has bump electrodes each electrically connected to support plate 1 and wiring conductor 5 on support plate 1 via insulating layer 16. FIG. 16 shows three or a plurality of light emitting diodes 2 mounted on support plate 1 within elliptical reflector 3. FIG. 17 shows wiring conductors 4, 5 juxtaposed on one side of support plate 1.

Figure 18:
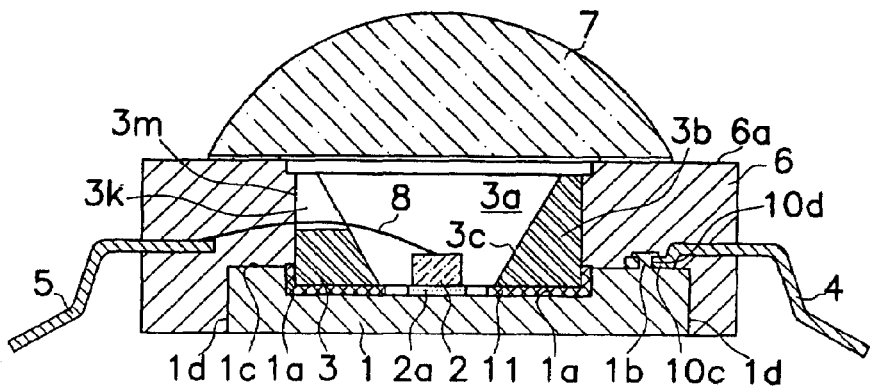
FIG. 18 is a sectional view of another embodiment of a semiconductor light emitting device according to the present invention.

Semiconductor light emitting device shown in FIG. 18 has a reflector 3 formed with a notch 3k straight extending from hole 3a to outer side surface 3m between light emitting diode 2 and wiring conductor 5. Lead wire 8 is connected between light emitting diode 2 and wiring conductor 5 through notch 3k.

Figure 19:
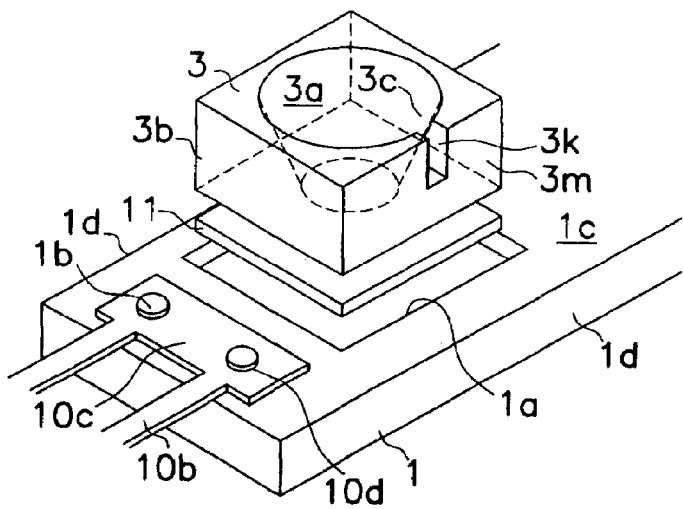
FIG. 19 is a perspective view illustrating a support plate and a reflector of the semiconductor light emitting device shown in FIG. 18.
Figure 20:
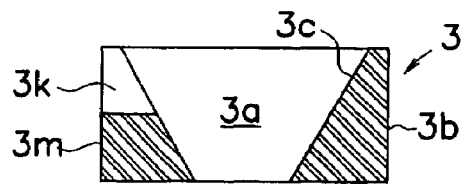
FIG. 20 is a sectional view of the reflector shown in FIG. 19.
Figure 21:
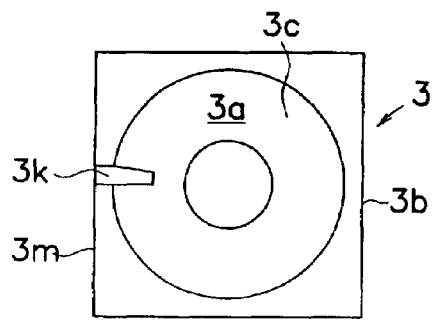
FIG. 21 is a plan view of the reflector shown in FIG. 19.
Figure 22:
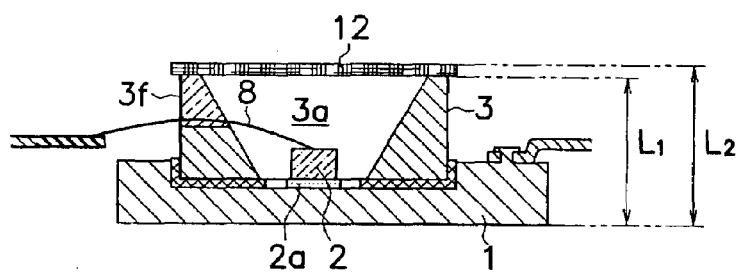
FIG. 22 is a sectional view illustrating the reflector shown in FIG. 19 with a cover attached on an upper surface of the reflector.
Figure 23:
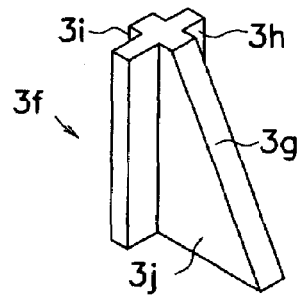
FIG. 23 is a perspective view of a filler.

In producing semiconductor light emitting device shown in FIG. 18, lead frame assembly 10 is provided as shown in FIG. 2 as in the case of FIG. 1. Then, as displayed in FIG. 19, reflector 3 is bonded in recess 1a of support plate 1 through insulating adhesive 11. As seen in FIGS. 19 to 21, reflector 3 comprises a reflector block 3b of generally rectangular shape with conical hole 3a at the center; and a notch 3k passing straight through reflector block 3b from hole 3a to outer side surface 3m between light emitting diode 2 and wiring conductor 5. Further, as illustrated in FIG. 22, light emitting diode 2 is adhered in recess 1a of support plate 1 within hole 3a of reflector 3 by means of solder or conductive bonding agent using well-known die bonder. Not shown but, light emitting diode 2 comprises a semiconductor substrate, anode and cathode electrodes formed on two main surfaces of the substrate, the cathode electrode being electrically connected to support plate 1. Cathode electrode of light emitting diode 2 is electrically connected to wiring conductor 5 via lead wire 8 passing through notch 3k by a well-known wire bonding technique, and then, a filler 3f is inserted into notch 3k over lead wire 8.

Figure 24:
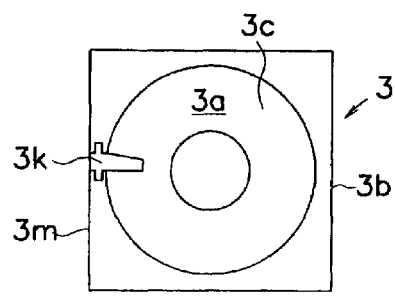
FIG. 24 is a plan view of a reflector with a notch formed in the reflector into a complementary shape to that of the filler.

Fillers 3f may be formed into various shapes, for example, one of fillers 3f comprises a triangle 3j with an inclined surface 3g which forms a portion of hole 3a of reflector 3; a back 3i formed on the opposite side of triangle 3j; and a pair of ribs 3h formed between triangle 3j and back 3i. As shown in FIG. 24, notch 3k is formed into a complementary sectional shape to that of filler 3f to receive filler 3f in notch 3k. When filler 3f is inserted into notch 3k from the top, it can be moved in the only vertical direction, but not in the lateral direction. After that, filler 3f is adhered in notch 3k with blazing metal or adhesive agent. In lieu of preformed filler 3f, blazing metal such as conductive paste (silver paste) or adhesive resin may be filled in notch 3k to form a filler. FIGS. 22, 25 to 27 illustrate embodiments fillers 3f formed of blazing metal or adhesive resin.

Figure 25:
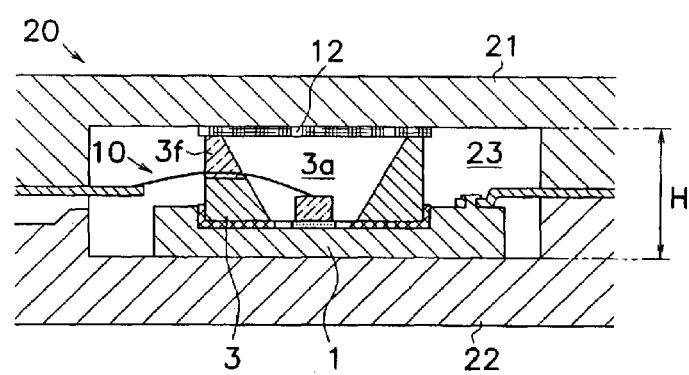
FIG. 25 is a sectional view showing a forming mold in which a lead frame assembly shown in FIG. 22 is mounted.
Figure 26:
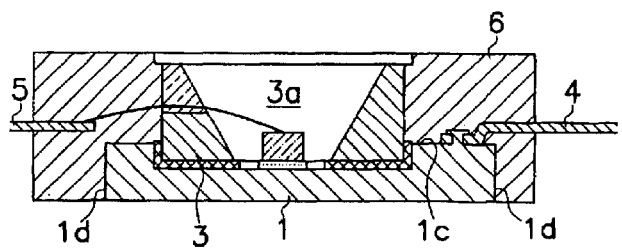
FIG. 26 is a sectional view of the lead frame assembly shown in FIG. 22 with a plastic encapsulant molded with the lead frame assembly.
Figure 27:
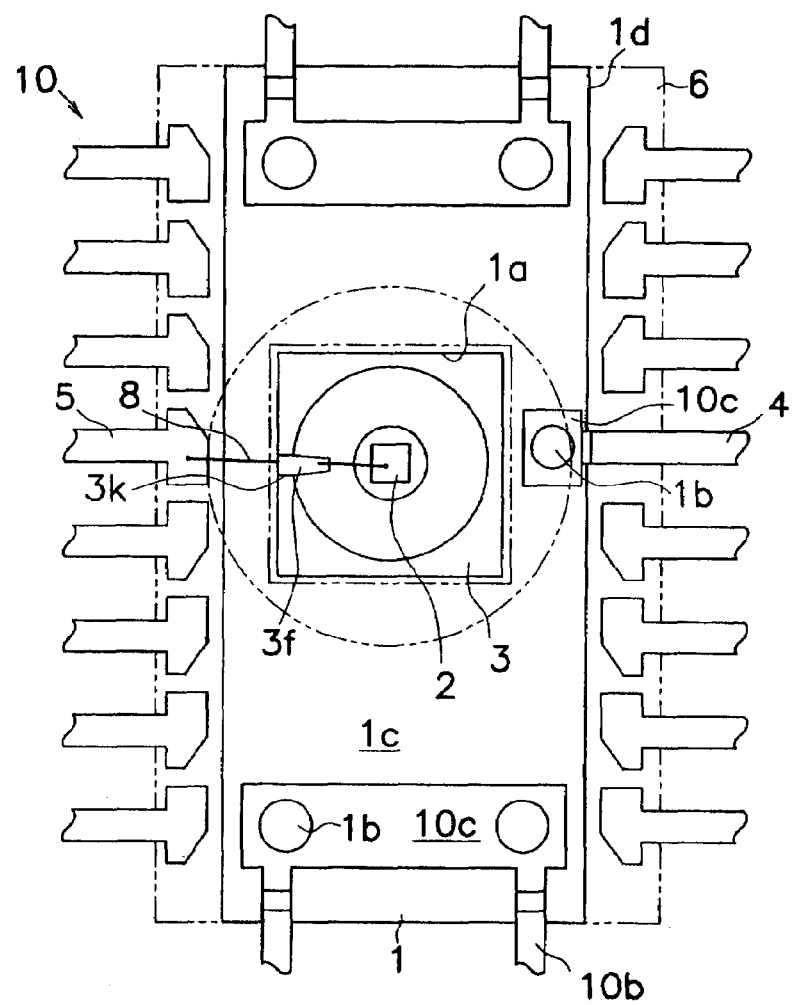
FIG. 27 is a plan view of the lead frame assembly shown in FIG. 26.

Subsequently, as shown in FIG. 22, cover 12 of PET resin is attached on upper surface of reflector 3 to seal hole 3a of reflector 3, and lead frame assembly 10 is incorporated in forming mold 20 as shown in FIG. 25. Similarly to the embodiment shown in FIG. 1, semiconductor light emitting device of FIG. 18 is formed by mounting lead frame assembly 10 in forming mold 20 wherein reflector 3 is fixed in cavity 23 in slightly crushed condition of cover 12 in tight contact to upper surface of cavity 23.

Under the condition, liquid resin is injected into cavity 23 through runner and gate, however, liquid resin is prevented from flowing into hole 3a because filler 3f is fitted in notch 3k and cover 12 envelops hole 3a of reflector 3. After lead frame assembly 10 is removed from forming mold 20, cover 12 is stripped from reflector 3 to obtain lead frame assembly 10 shown in FIG. 26 with plastic encapsulant 6 for sealing main surface 1c and side surfaces 1d of support plate 1 outside of reflector 3 and inner ends of wiring conductors 4, 5. Later, lens 7 of light-transmittable resin is attached on upper surface of reflector 3 as shown in FIG. 18, and useless portions are cut off from lead frame assembly 10 shown in FIG. 27 to obtain final semiconductor light emitting device. Filler 3f may be removed after formation of plastic encapsulant 6. As shown in FIG. 1, semiconductor light emitting device may be provided without filler 3f.

Figure 28:
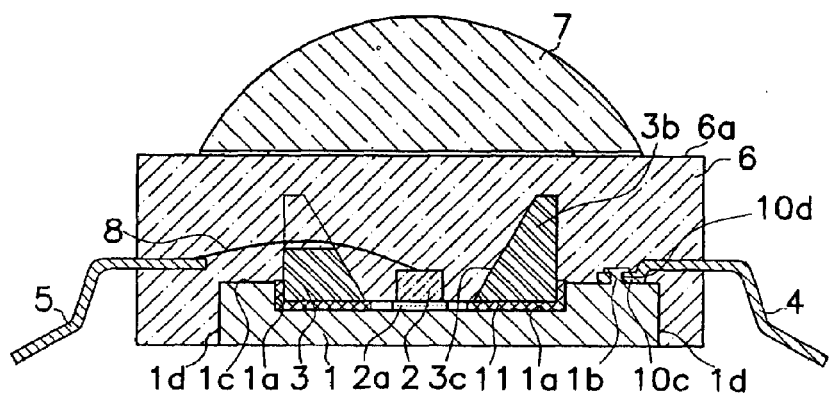
FIG. 28 is a sectional view of a still another embodiment of a semiconductor light emitting device according to the present invention.
Figure 29:
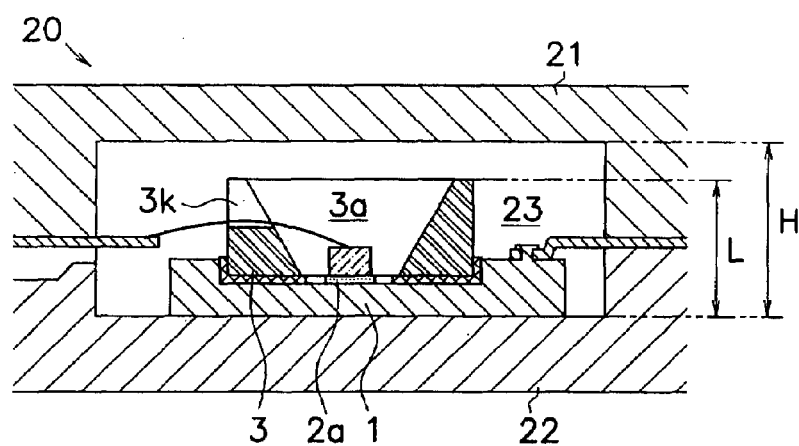
FIG. 29 is a sectional view of a forming mold with a gap between an upper surface of a reflector and a cavity surface of an upper mold half.
Figure 30:
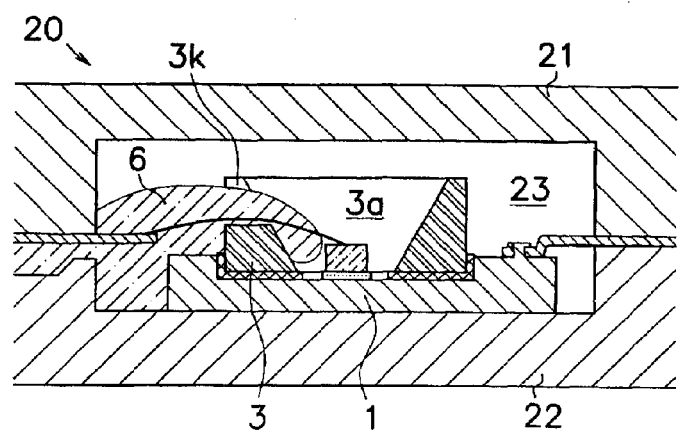
FIG. 30 is a sectional view illustrating resin injection into the cavity of the forming mold shown in FIG. 29.

In the foregoing embodiments, light emitting diodes may be produced without using filler 3f received in notch 3k. FIG. 28 illustrates an example of molding of plastic encapsulant 6 incorporated with lead frame assembly 10 by supplying light-transmittable epoxy resin into hole 3a of reflector 3 through notch 3k using a well-known transfer molding technique. In preparing semiconductor light emitting device shown in FIG. 28, forming mold 20 comprises as shown in FIG. 29 upper and lower mold halves 21, 22 for defining cavity 23 wherein added height L of support plate 1 and reflector 3 is lower than height H of cavity 23 namely between top and bottom walls of cavity 23. As a result, when upper and lower mold halves 21, 22 are clamped after lead frame assembly 10 is mounted in forming mold 20 together with reflector 3 attached to lead frame assembly 10, a channel (gap) is formed between upper surface of reflector 3 and upper mold half to provide a resin path. In this condition, when melt is fed under pressure into cavity 23 through runner and gate, a sufficient amount of melt is supplied to hole 3a through notch 3k and channel between upper surface of reflector 3 and upper mold half.

Figure 31:
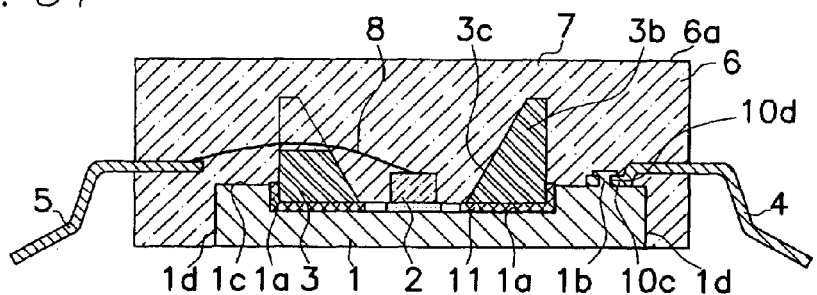
FIG. 31 is a sectional view of a semiconductor light emitting device with a plastic encapsulant molded by injecting resin into the cavity and a hole of the reflector of the lead frame assembly shown in FIG. 22.

When lead frame assembly 10 is removed from forming mold 20, plastic encapsulant 6 is formed which covers main surface 1c and side surfaces 1d of support plate 1 outside of reflector 3, inner ends of wiring conductors 4, 5 and fills hole 3a of reflector 3. Plastic encapsulant 6 has no interior void, air bubble or unfilled due to sufficient injection of melt into cavity 23, causing good semiconductor light emitting devices of reliable quality as shown in FIG. 31. Finally, lens 7 of light-transmittable resin is attached on reflector 3, lopping needless portions to finish semiconductor light emitting device. Plastic encapsulant 6 of semiconductor light emitting device shown in FIG. 28 is formed of transparent resin having the high melting point. Also, lens 7 is formed of transparent resin of similar or another kind. In semiconductor light emitting devices shown in FIGS. 18 and 28, lens 7 may be omitted if reflector 7 has a sufficient directivity of light toward outside similarly to the structure shown in FIG. 1. Reflector 3 may be formed of a same conductive metal or resin as that of support plate 1.

As semiconductor light emitting device shown in FIG. 18 or 28 produces light as relatively large amount of electric current can flow vertically between anode and cathode electrodes of light emitting diode 2. In addition thereto, the following effects can be obtained:

[1] Shortened lead wire 8 can pass through notch 3k of reflector 3 in the substantially linear configuration to electrically connect wiring conductor 5 and light emitting diode 2, preventing warpage of lead wire 8.

[2] Reduction of inner diameter of reflective surface 3c and increase of height of reflector 3 serve to improve directivity and axial brightness.

[3] Lead wire 8 can easily be connected between wiring conductor 5 and light emitting diode 2.

[4] Lead wire 8 does not need to bridge over upper surface of reflector 3 to prevent disconnection of lead wire 8 and improve reliability of product quality.

[5] Reducing diameter of reflector reflective surface 3c can attain the downsizing of reflector 3.

[6] Thermal deterioration of resin can be avoided because light emitting diode 2 is not in direct contact to less heat resistible resin due to empty hole 3a or utilization of heat resistible resin.

[7] Metallic support plate 1 having the high heat conductivity can discharge outside heat produced when light emitting diode 2 is turned on with heavy current flowing through first and second wiring conductors 4, 5.

[8] Heat degradation can be controlled utilizing heat-resistible plastic encapsulant 6.

[9] Internal reflection on reflector 3 can efficiently attain light emission from light emitting diode 2 to the outside.

[10] Infiltration of foreign matter such as moisture can be prevented by enveloping structure of support plate 1 and reflector 3 for light emitting diode 2 to repress quality deterioration of light emitting diode 2 for reliable package structure.

[11] Conical surface of reflector 3 can advantageously reflect light from light emitting diode 2 toward lens 7 which focuses light from diode 2 with high directivity. To this end, inclined angle of conical surface is set at an angle 30 degrees or more relative to the bottom surface.

[12] Resin can be filled in hole 3a of reflector 3 around light emitting diode 2 without void in resin.

Figure 32:
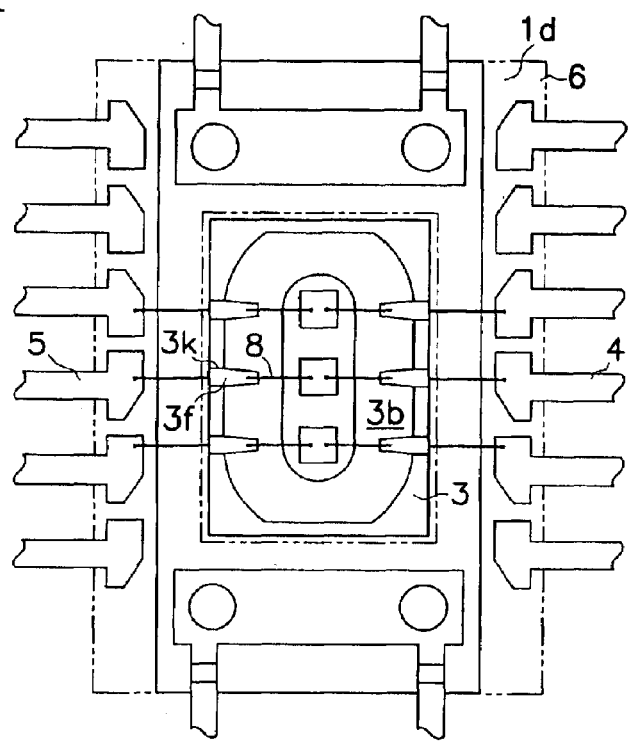
FIG. 32 is a plan view of a further semiconductor light emitting device according to the present invention with three light emitting diode chips.
Figure 33:
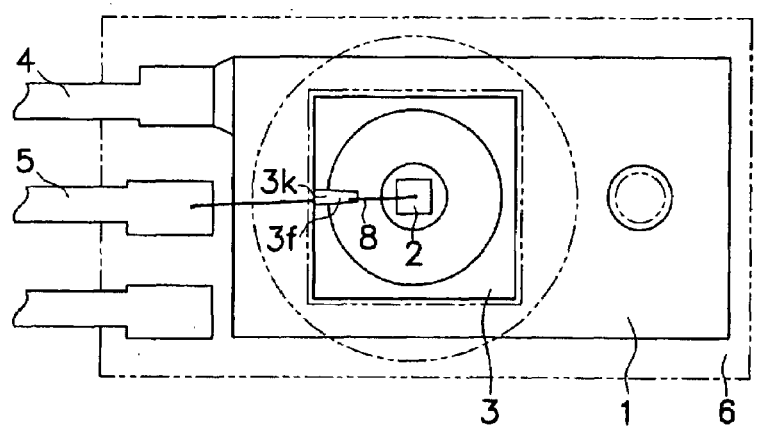
FIG. 33 is a plan view of a still further semiconductor light emitting device according to the present invention with wiring conductors juxtaposed on one side of a support plate.
Figure 34:
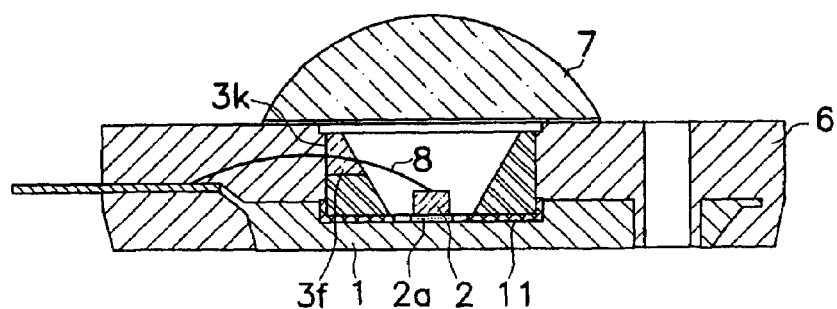
FIG. 34 is a sectional view of the semiconductor light emitting device shown in FIG. 33.
Figure 35:
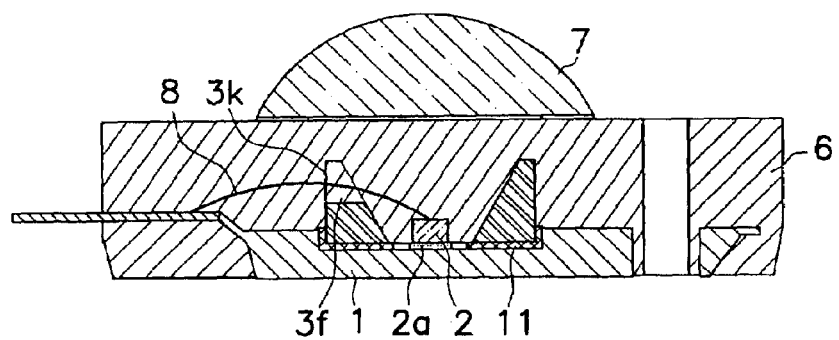
FIG. 35 is a sectional view of the semiconductor light emitting device shown in FIG. 33 with a plastic encapsulant which fills a hole of the reflector.
Figure 36:
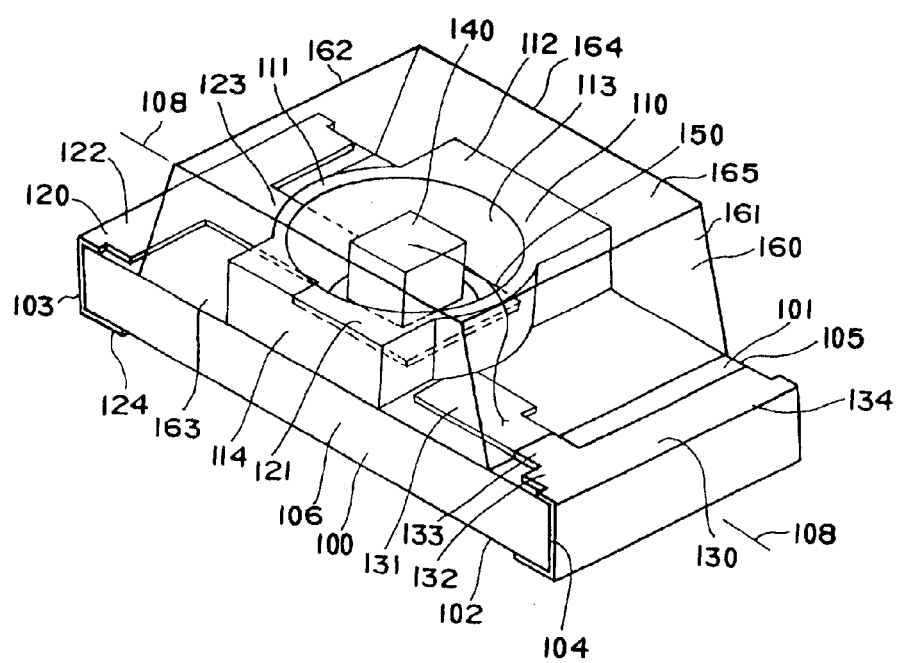
FIG. 36 is a perspective view of a prior art semiconductor light emitting device.

Various modifications can be made regarding the embodiment shown in FIG. 18 or 28. FIG. 32 illustrates three or few light emitting diodes 2 in an elliptic reflector 3 on support plate 1. FIGS. 33 to 35 exhibit wiring conductors 4, 5 apposed on one side of support plate 1. Reflector 3 may be secured on a flat main surface 1c of support plate 1 without recess 1a. Light emitting diode 2 may previously be mounted on main surface 1c of support plate 1 before reflector 3 is bonded on support plate 1. Reflector 3 may be formed integrally with support plate 1 of metallic material such as copper or aluminum, etc. Lens 7 may be formed integrally with plastic encapsulant 7 by a transfer molding technique.

Light-transmittable resin for lens 7 tends to be subject to thermal degradation in comparing it with black plastic encapsulant 6 and silicone resin. However, in the embodiments according to the present invention, lens 7 which is subject to thermal degradation, is located away from light emitting diode 2 as a heat source, wiring conductors 4, 5 and support plate 1 for transferring heat from light emitting diode 2 to ensure protection of lens 7 against heat from light emitting diode 2. Also, as optical axis of lens 7 is positioned in alignment with a central axis of light emitting diode 2, lens 7 can effectively converge upward or vertical light from light emitting diode 2 or reflected on reflective surface 3c of reflector 3 after laterally irradiated from light emitting diode 2.

In addition, in the semiconductor light emitting devices shown in FIGS. 1 and 18, plastic encapsulant 6 is formed of thermosetting black epoxy resin which is typically used for packages of heat-resistant power transistors or the like, and the epoxy resin contains a larger amount of thermostable compound than that blended in light-transmittable resin. Accordingly, plastic encapsulant 6 barely deteriorates its adhesiveness to other components even though continuous heat is loaded on plastic encapsulant 6. Thus, no undesirable gap is produced between plastic encapsulant 6 and wiring conductors 4, 5 to provide a reliable semiconductor light emitting device of high light power with a durable environmental resistance.

INDUSTRIAL APPLICABILITY

As mentioned above, in the present invention, thermal degradation can be avoided because plastic encapsulant is formed of heat-resistible resin. Deformation of lead wire connected to semiconductor light emitting element can be prevented because wiring span of lead wire can be shortened to provide a reliable semiconductor light emitting device. Moreover, smaller diameter of reflective surface and higher reflector enable to improve directivity and axial brightness of light in semiconductor light emitting device.

What is claimed is:

1. A semiconductor light emitting device comprising a support plate; a light-reflective reflector having a reflector block which is mounted on the support plate or integrally formed with the support plate, the reflector being formed with a hole upwardly expanding; a semiconductor light emitting element mounted on the support plate within the hole of the reflector; a first wiring conductor electrically connected to one electrode of the light emitting element; a second wiring conductor electrically connected to the other electrode of the light emitting element through a lead wire;

wherein the reflector block of the reflector has a notch to extend downwardly from an upper surface of the reflector in the direction toward the second wiring conductor from the light emitting element to communicate the hole with an outside of the reflector block;

the lead wire passes through the notch and strides over the reflector to electrically connect the light emitting element and the second wiring conductor.

2. A semiconductor light emitting device comprising a metallic support plate; a light-reflective reflector mounted on the support plate and formed with an upwardly diverging hole; a semiconductor light emitting element mounted on the support plate within the hole of the reflector, the light emitting element having a first electrode electrically connected to the support plate; a first wiring conductor electrically connected to the support plate; a second wiring conductor electrically connected to a second electrode of the light emitting element; and a heat-resistible plastic encapsulant formed of opaque or semi-transparent resin for sealing at least an outer periphery of the reflector, an upper surface of the support plate, each inner end of the first and second wiring conductors;

wherein said plastic encapsulant is formed by injecting a liquid resin into a cavity of a forming mold under the condition of the support plate and the reflector clamped between upper and lower mold halves of the forming mold to form an opening at the top of said plastic encapsulant; and said opening upwardly exposes the hole and an upper surface of the reflector outside of said plastic encapsulant.

3. The semiconductor light emitting device of claim 2, wherein the support plate is formed of a metallic material having the thermal conductivity equal to or more than 190 kcal/mh° C.

4. The semiconductor light emitting device of claim 2, wherein the plastic encapsulant is formed of black epoxy resin.

5. The semiconductor light emitting device of claim 2, further comprising a lens formed of light-transmittable or transparent resin for covering upper surfaces of the reflector and plastic encapsulant.

6. The semiconductor light emitting device of claim 5, further comprising a light-transmittable or transparent cover for covering a hole of the reflector.

7. The semiconductor light emitting device of claim 6, wherein the lens is formed of a resin which has the melting point lower than that of the plastic encapsulant.

8. A semiconductor light emitting device comprising a metallic support plate; a light-reflective reflector mounted on the support plate and formed with a hole upwardly diverging; a semiconductor light emitting element mounted on the support plate within the hole of the reflector, the light emitting element having a first electrode electrically connected to the support plate; a first wiring conductor electrically connected to the support plate; a second wiring conductor electrically connected to a second electrode of the light emitting element; and a heat-resistible plastic encapsulant formed of opaque or semi-transparent resin for sealing at least an outer periphery of the reflector, an upper surface of the support plate, each inner end of the first and second wiring conductors;

wherein said plastic encapsulant comprises an opening at the top thereof to upwardly expose the hole and an upper surface of the reflector outside of said plastic encapsulant, and a shoulder formed at a lower position than that of an upper surface of said plastic encapsulant in parallel to an upper surface of the reflector around the opening.

9. A semiconductor light emitting device comprising a metallic support plate; a light-reflective reflector mounted on the support plate and formed with a hole upwardly diverging; a semiconductor light emitting element mounted on the support plate within the hole of the reflector, the light emitting element having a first electrode electrically connected to the support plate; a first wiring conductor electrically connected to the support plate; a second wiring conductor electrically connected to a second electrode of the light emitting element; a light-transmittable or transparent cover attached on an upper surface of the reflector; and a heat-resistible plastic encapsulant formed of opaque or semi-transparent resin for sealing at least an outer periphery of the reflector, an upper surface of the support plate, side surfaces of the cover, each inner end of the first and second wiring conductors.

10. A semiconductor light emitting device comprising a metallic support plate; a light-reflective reflector mounted on the support plate and formed with a hole upwardly diverging; a semiconductor light emitting element mounted on the support plate within the hole of the reflector, the light emitting element having a first electrode electrically connected to the support plate; a first wiring conductor electrically connected to the support plate; a second wiring conductor electrically connected to a second electrode of the light emitting element; and a heat-resistible plastic encapsulant formed of opaque or semi-transparent resin for sealing at least an outer periphery of the reflector, an upper surface of the support plate, each inner end of the first and second wiring conductors;

wherein said plastic encapsulant is provided with an opening through which the hole and an upper surface of the reflector are exposed outside of said plastic encapsulant; and an upper surface of said plastic encapsulant is in parallel to an upper surface of the reflector.

11. A semiconductor light emitting device comprising a support plate; a light-reflective and electrically conductive reflector mounted on the support plate and formed with a hole upwardly diverging; a semiconductor light emitting element mounted on the support plate within the hole of the reflector;

and a plastic encapsulant for sealing at least an outer periphery of the reflector and an upper surface of the support plate;
  wherein the reflector has a reflector block formed with the hole at the center, and a ledge extending outwardly from the reflector block and connecting to a wiring conductor; and
  the ledge electrically connects the light emitting element and wiring conductor.

12. The semiconductor light emitting device of claim 11, wherein the ledge is electrically connected to the wiring conductor via brazing metal.

13. The semiconductor light emitting device of claim 11, wherein a lead wire electrically connects the semiconductor light emitting element and a flat area formed in the reflector.

* * * * *